(12) United States Patent
Tseng et al.

(10) Patent No.: US 7,508,007 B2
(45) Date of Patent: Mar. 24, 2009

(54) PACKAGE STRUCTURE OF LIGHT-EMITTING DIODE

(75) Inventors: Wen Liang Tseng, Hsinchu (TW); Lung Hsin Chen, Hsinchu County (TW)

(73) Assignee: Advanced Optoelectronic Technology, Inc., Taiwan (CN)

( * ) Notice: Subject to any disclaimer, the term of this patent is extended or adjusted under 35 U.S.C. 154(b) by 23 days.

(21) Appl. No.: 11/725,508

(22) Filed: Mar. 20, 2007

(65) Prior Publication Data
US 2007/0221935 A1   Sep. 27, 2007

(30) Foreign Application Priority Data
Mar. 24, 2006   (TW) .............................. 95110220 A

(51) Int. Cl.
*H01L 29/74* (2006.01)

(52) U.S. Cl. ......................................... 257/98; 257/99

(58) Field of Classification Search ................... 257/98, 257/99
See application file for complete search history.

(56) References Cited

U.S. PATENT DOCUMENTS
6,054,716 A * 4/2000 Sonobe et al. ............... 250/552

* cited by examiner

*Primary Examiner*—Douglas M Menz
(74) *Attorney, Agent, or Firm*—Oliff & Berridge, PLC

(57) ABSTRACT

A package structure of a light-emitting diode (LED) comprises a package carrier, an LED die mounted and electrically connected to the package carrier, a molding compound covering the package carrier and the LED die, and two electrodes disposed on opposite end portions of the molding component. A reflecting layer is overlaid on two side surfaces of the molding component facing the LED die, respectively. Thus, the rays emitted by the LED die are reflected by the reflecting layer and directed above the circuit surface of the LED die. Afterward, they pass through the molding compound to access the outside of the LED package. Each electrode has at least two surfaces vertical to each other, and is respectively electrically connected to a P-electrode and an N-electrode of the LED die.

12 Claims, 6 Drawing Sheets

PACKAGE STRUCTURE OF LIGHT-EMITTING DIODE

BACKGROUND OF THE INVENTION

1. Field of the Invention

The present invention relates to a package structure of an LED, and more particularly to a package structure having a reflecting surface for concentrating and emitting rays generated by the LED.

2. Description of the Related Art

LEDs, having advantages such as small volume, high light-emitting efficiency, and long lifespan, have been regarded as optimal light sources for next-generation green power-saving illumination. In addition, with the quick development of liquid crystal displays (LCDs) and prevalence of full color screens, white light LEDs are applied in indicator lamps and large-scale bulletin boards, etc., and also used in various consumable electronic products, such as backlight modules of LCD panels in mobile phones and PDAs.

Due to the limitation of the inner space of an electronic product, the light source of a backlight module must be disposed on a side surface of the LCD panel in the electronic product. FIG. 1 is a schematic perspective view of an LED module as a backlight module light source in the prior art. An LED module 10 includes a case 11, a plurality of LEDs 14, and a pair of external electrodes 12 and 13. The rays generated by the LED 14 can be emitted through one side of an opening of the case 11. In order to prevent the LED 14 from being damaged by the external force, a transparent plastic material 15 can be injected into the case 11 for protection. Currently, the case 11 is mainly formed by a plastic material or a ceramic material, and the case 11 made of the plastic material is fabricated by means of injection molding. The wall of the case 11 is increasingly thinned to meet the unceasing requirements, and it is even made to be 0.075 mm at present. However, due to the requirement for thinning the wall, the technical difficulty is aggravated, so the fabricating cost is greatly increased. Moreover, it becomes more difficult to inject the transparent plastic material 15 into the extremely thin case 11.

FIG. 2 is a top view of a conventional side emission LED. According to the LED 20, an LED die 24 is adhered on a package carrier, and then the combination of the package carrier and the die 24 is molded into a package body with an external molding compound 21. The package carrier can be a ceramic (e.g., $Al_2O_3$ and AlN) substrate or a plastic substrate, and can also be replaced by a lead frame. The material of the metal lead frame can be aluminum, copper, silver-plated Al or silver-plated copper, Al—Si alloy, Al—Mg alloy, Al—Mg—Si alloy, or Al—Cu alloy. A material with relatively higher reflectivity is attached to the surface of the molding compound 21 around the die 24, or a white ceramic material is used as a reflector in a form of a cup or a hemispherical case, so that the emitted rays mainly pass through a window 25 above the die 24 to the outside. The window 25 can be fabricated by a transparent epoxy resin material. If a fluorescent powder is added into the epoxy resin, e.g., a fluorescent powder of yttrium aluminum garnet (YAG) series or silicate series is added, a multi-wavelength white light is produced. Finally, two electrodes 22 and 23 are formed outside the molding compound 21, thus finishing the package structure of the LED 20. However, the fabricating process and inner configuration of this structure are relatively complicated, and when the electrodes are subsequently combined with an external circuit board, the surface mount of the LED 20 is achieved only in the form of side emission.

As a result, the market is in urgent need of an LED with a simple fabricating process that is capable of applying different light-emitting forms.

SUMMARY OF THE INVENTION

An objective of the present invention is to provide a package structure of an LED capable of effectively simplifying a reflecting structure of the LED, so that the fabricating process is simple and the fabricating cost is reduced.

Another objective of the present invention is to provide a package structure of an LED. Each electrode of the LED at least has two surfaces vertical to each other, so that when they are adhered to an external circuit board, a mounting direction can be selected. That is, the LED can act as either a side emission light source or a top emission light source on a circuit board.

Another objective of the present invention is to provide a package structure with superior heat dissipation. A reflecting layer is disposed on a surface of a molding compound, so the heat generated during light emission will not be blocked by the conventional inner reflecting construction, as in the prior art.

In order to achieve the above objectives, the present invention provides a package structure of an LED, which includes a package carrier, an LED die mounted and electrically connected to the package carrier, a molding compound overlaying the package carrier and the LED die, and two electrodes disposed on opposite end portions of the molding compound. A reflecting layer is overlaid on the surfaces of two sides of the molding compound facing the LED die, respectively. Thus, the rays emitted by the LED die are reflected by the reflecting layer and directed above the circuit surface of the LED die. Afterward, they pass through the molding compound to access the outside of the LED package. Each electrode has at least two surfaces vertical to each other, and is respectively electrically connected to a P-electrode and an N-electrode of the LED die.

The package carrier can be a ceramic substrate or a plastic substrate, and can also be replaced by a metal lead frame. The material of the metal lead frame can be aluminum, copper, silver-plated aluminum, silver-plated copper, Al—Si alloy, Al—Mg alloy, Al—Mg—Si alloy, or Al—Cu alloy, etc.

BRIEF DESCRIPTION OF THE DRAWINGS

The invention will be described according to the appended drawings in which.

PREFERRED EMBODIMENT OF THE PRESENT INVENTION

Figure 1:
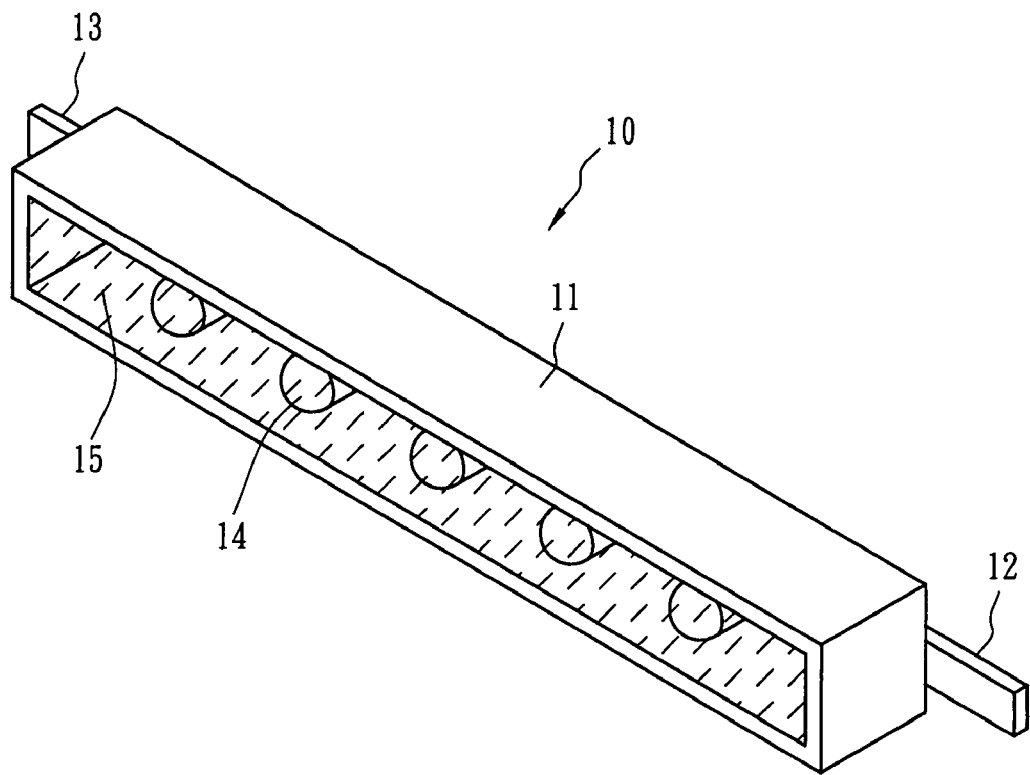
FIG. 1 is a schematic perspective view of the light source of a backlight module in a conventional LED module.
Figure 2:
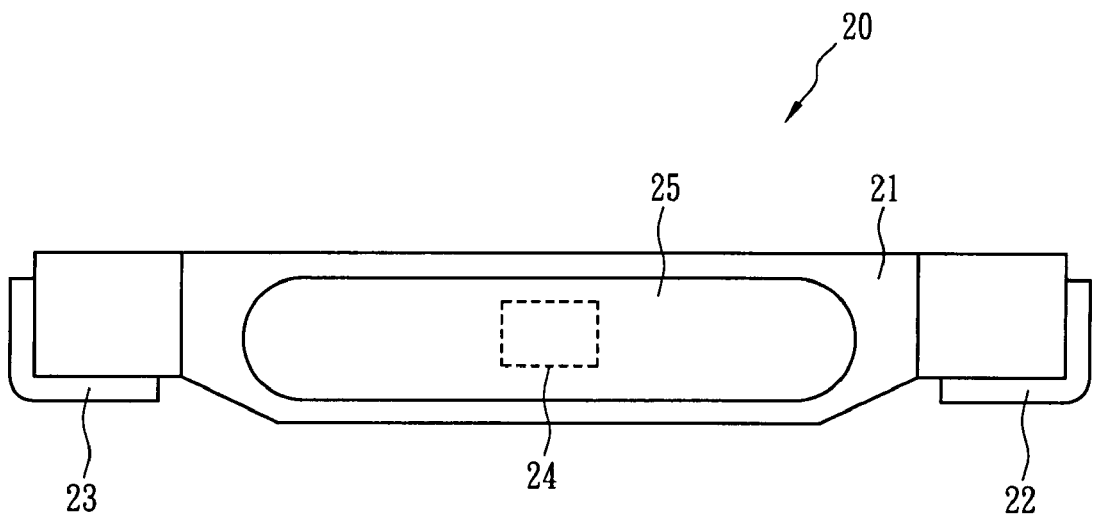
FIG. 2 is a top view of a conventional side emission LED.
Figure 3:
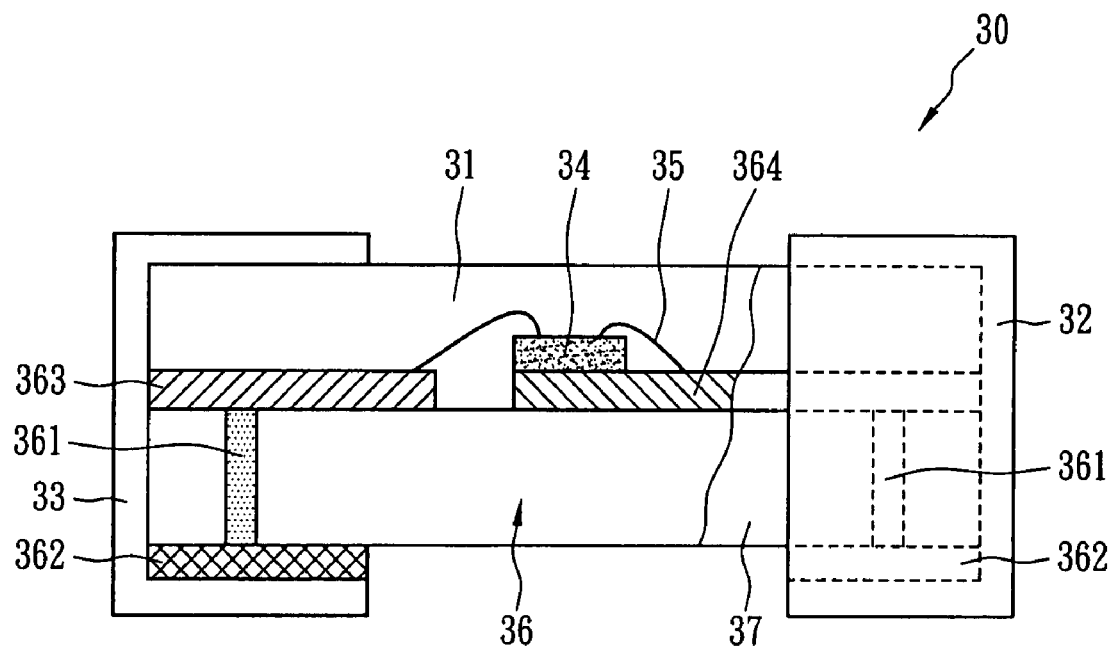
FIG. 3 is a cross-sectional side view of a package structure of an LED according to a first embodiment of the present invention.

FIG. 3 is a cross-sectional side view of a package structure of an LED according to a first embodiment of the present invention. The LED 30 includes a substrate 36, an LED die 34 fixed and electrically connected to a substrate (package carrier) 36, a molding compound 31 covering the substrate 36 and the LED die 34, and a first electrode 32 and a second electrode 33 disposed on opposite end portions of the molding compound 31. A reflecting layer 37 is overlaid on the surfaces of two opposite sides of the molding compound 31 surrounding the LED die 34, respectively. Thus, the rays emitted by the LED die 34 are reflected by the reflecting layer 37 and directed above a surface of the circuit of the LED die 34. Afterward, they pass through the molding compound 31 to access the outside of the LED 30. According to the color of the rays emitted by the LED die 34, the reflecting layer 37 of the material with good reflectivity to this color can be preferably selected. Furthermore, a suitable material can be overlaid on two opposite surfaces of the molding compound 31 based on the result of the mixed light of the LED 30. For example, if a white mixed light is emitted, a white paint is preferably selected.

The LED die 34 is electrically connected to a P-electrode lead 363 and an N-electrode lead 364 on the substrate 36 by two metal wires 35, respectively. The P-electrode lead 363 and the N-electrode lead 364 are respectively connected to bottom electrode leads 362 on the substrate 36 via a conductive column 361.

Each of the first electrode 32 and the second electrode 33 at least has two surfaces vertical to each other, and contact a bottom electrode lead 362 respectively, so as to be connected to either a P-electrode or an N-electrode of the LED die 34. Fluorescent powders can be added in the molding compound 31, and the fluorescent powders can be YAG series, silicate series, or calcium halophosphate series, etc., such as $(Y_{3-x-y}Ce_xGd_y)Al_5O_{12}$, $(Y_{3-x}Ce_x)Al_5O_{12}$, $(Y_{2.95-a}Ce_{0.05}Gd_a)Al_5O_{12}$, $(Y_{2.95}Ce_{0.05})(Al_{5-b}Ga_b)O_{12}$, $(Y_{2.95-a}Ce_{0.05}Gd_a)(Al_{5-b}Ga_b)O_{12}$, $(Y_{2.95}Tb_{0.05})Al_5O_{12}$, and $(Y_{2.9}Eu_{0.1})Al_5O_{12}$. The initial rays emitted by the LED die 34 excite the fluorescent powders to generate secondary rays, and the initial rays and the secondary rays are mixed to form multi-wavelength light, e.g., white light.

Figure 4:
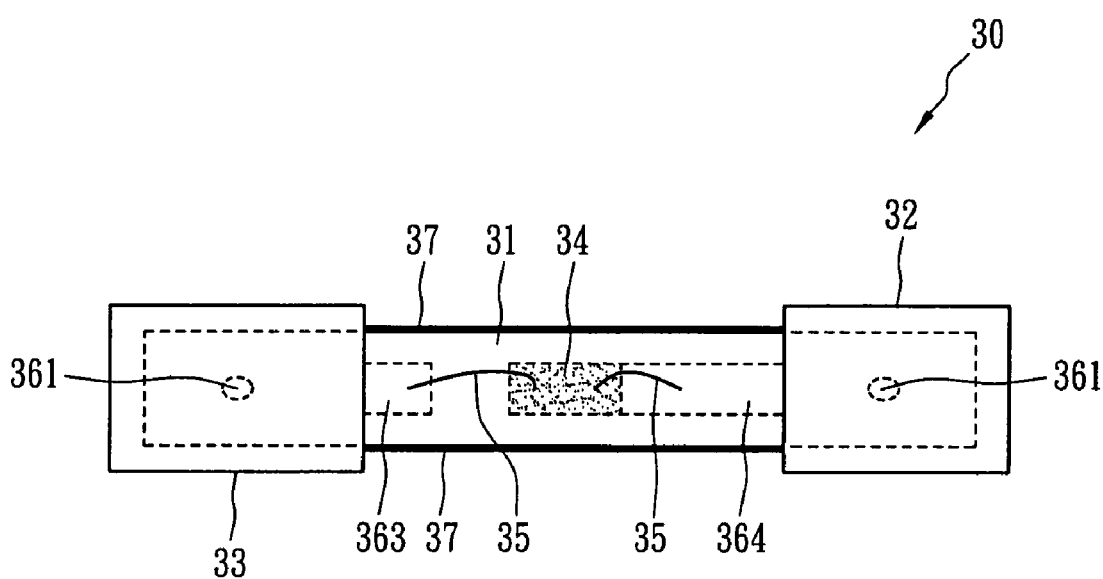
FIG. 4 is a top view of the LED in FIG. 3.

FIG. 4 is a top view of the LED of FIG. 3. The reflecting layer 37 is overlaid on two side surfaces of the molding compound 31, so that after being reflected, the rays are directed above the LED die 34 to radiate outward. As the first electrode 32 and the second electrode 33 respectively have five surfaces vertical to one another, if the lower surfaces of the first electrode 32 and the second electrode 33 in FIG. 4 are mounted on a circuit board, the LED 30 acts as a side emission LED. If the lower surfaces of the first electrode 32 and the second electrode 33 in FIG. 3 are mounted on a circuit board, the LED 30 acts as a top emission LED.

Figure 5:
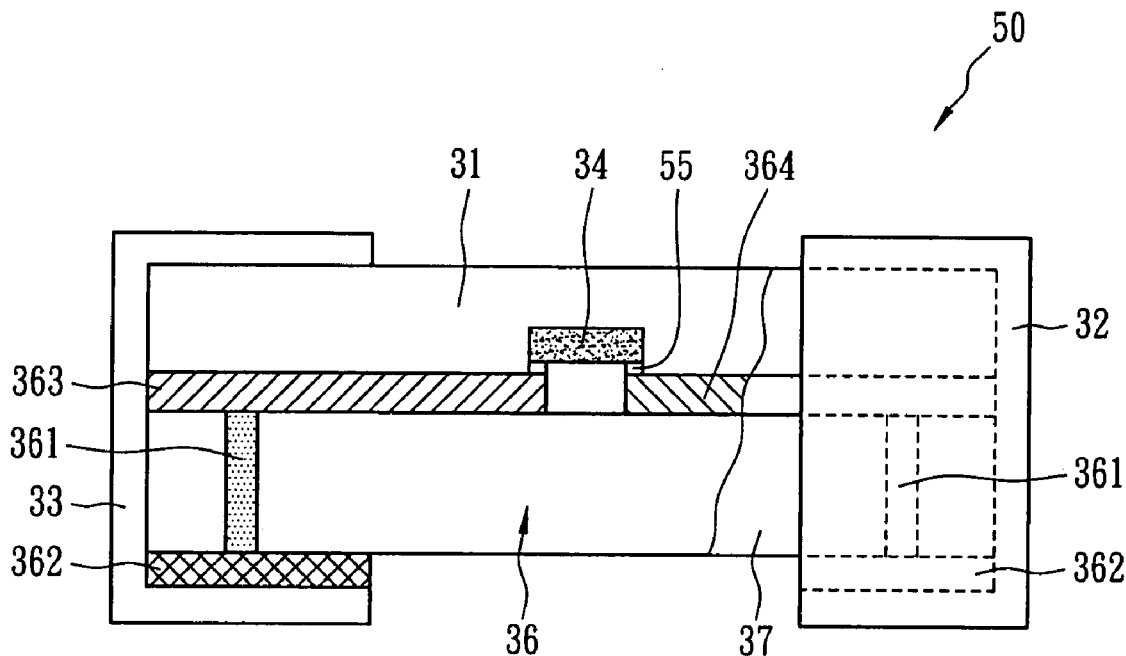
FIG. 5 is a cross-sectional side view of a package structure of an LED according to a second embodiment of the present invention.
Figure 6:
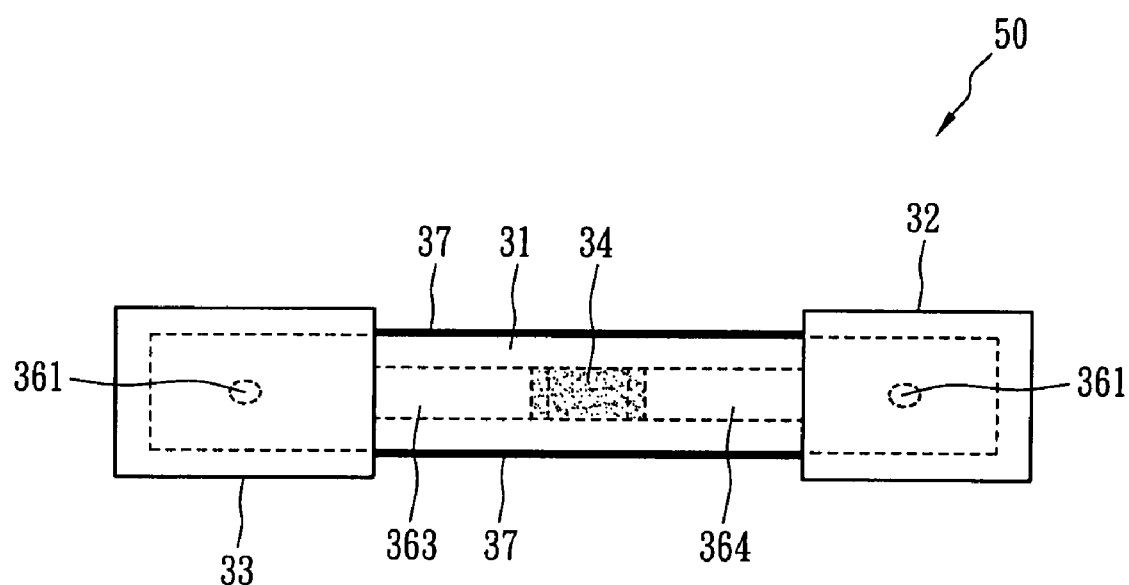
FIG. 6 is a top view of the LED in FIG. 5.

FIG. 5 is a cross-sectional side view of a package structure of an LED according to a second embodiment of the present invention. The LED 50 includes a substrate 36, an LED die 34 mounted and electrically connected to a substrate 36, a molding compound 31 overlaying the substrate 36 and the LED die 34, and a first electrode 32 and a second electrode 33 disposed on opposite end portions of the molding compound 31. The reflecting layer 37 is overlaid on two side surfaces of the molding compound 31 surrounding the LED die 34. Thus, the rays emitted by the LED die 34 are reflected by the reflecting layer 37 and directed above a surface of the circuit of the LED die 34. Afterwards, they pass through the molding compound 31 to access the outside of the LED 50. According to the color of the rays emitted by the LED die 34, the reflecting layer 37 of the material with good reflectivity to this color can be preferably selected. Furthermore, a suitable material can be overlaid on two opposite surfaces of the molding compound 31 based on the result of the mixed light of the LED 30. FIG. 6 is a top view of the LED of FIG. 5.

Compared with the LED 30 in FIG. 3 that has the LED die 34 connected to the P-electrode 363 and the N-electrode 364 on the substrate 36 by the metal wire 35, the LED 50 in FIG. 5 has the LED die 34 connected to the P-electrode 363 and the N-electrode 364 on the substrate 36 by bumps 55. Therefore, an interconnection is achieved by a flip-chip method instead of wire bonding.

Figure 7:
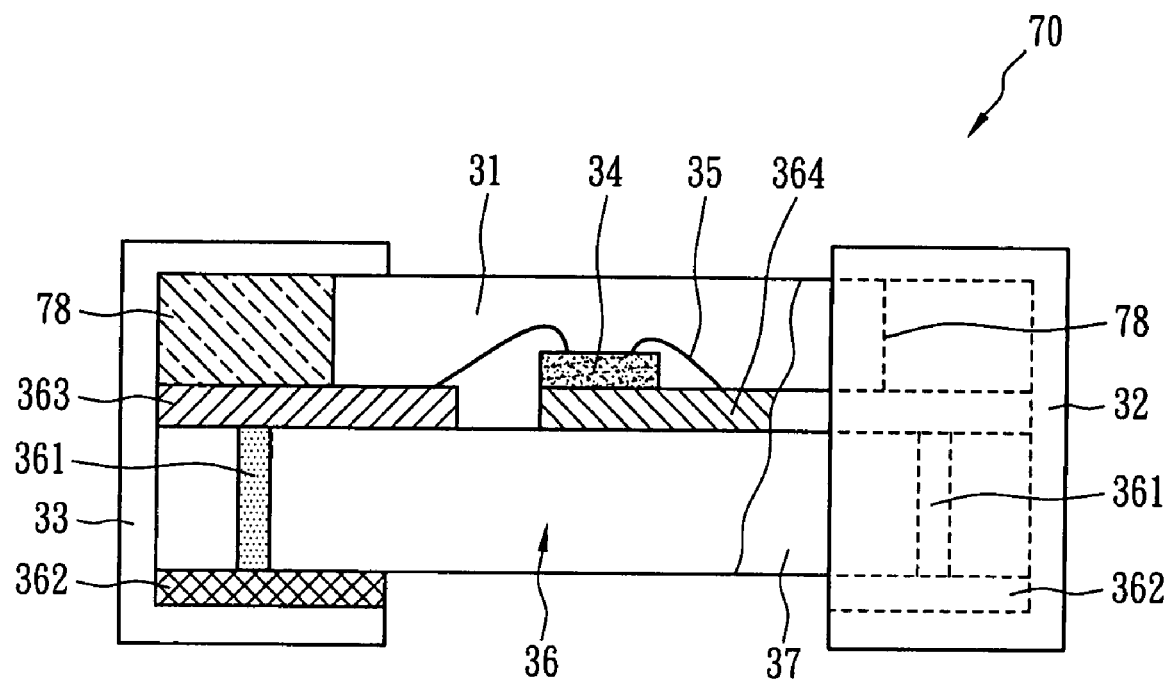
FIG. 7 is a cross-sectional side view of a package structure of an LED according to a third embodiment of the present invention.
Figure 8:
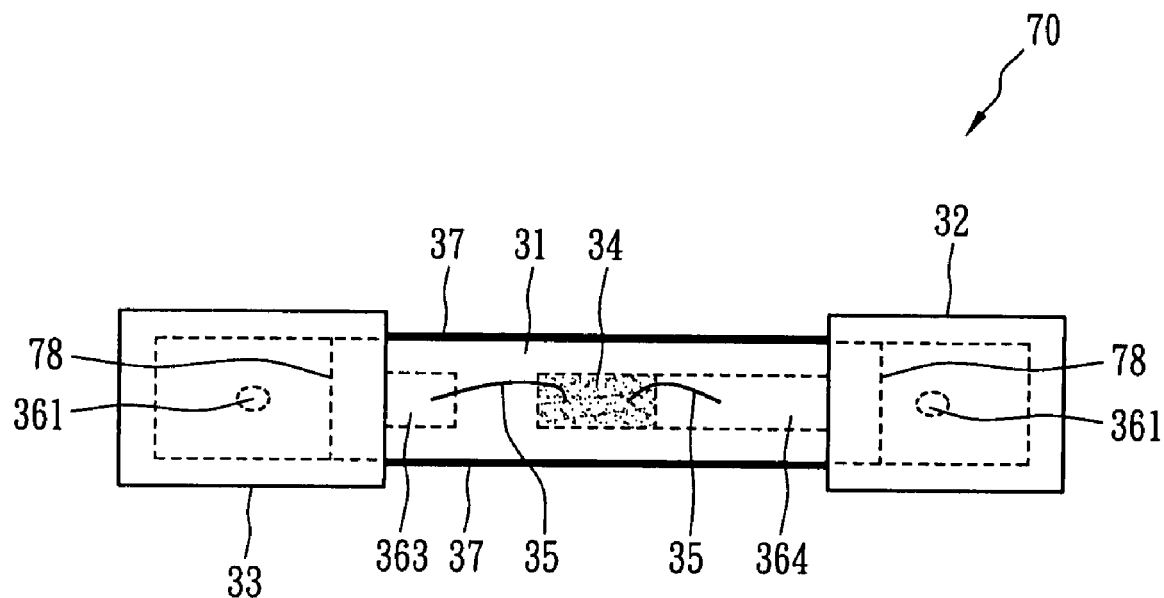
FIG. 8 is a top view of the LED in FIG. 7.

In addition to coating the reflecting layer 37 on the molding compound 31, reflectors 78 can be disposed inside the first electrode 32 and the second electrode 33 respectively, as shown in the LED 70 in FIG. 7. The reflectors 78 inside the first electrode 32 and the second electrode 33 can concentratedly direct rays emitted towards the end portions to the center of the molding compound 31 and finally pass through above the circuit surface of the LED die 34. FIG. 8 is a top view of the LED of FIG. 7.

Figure 9:
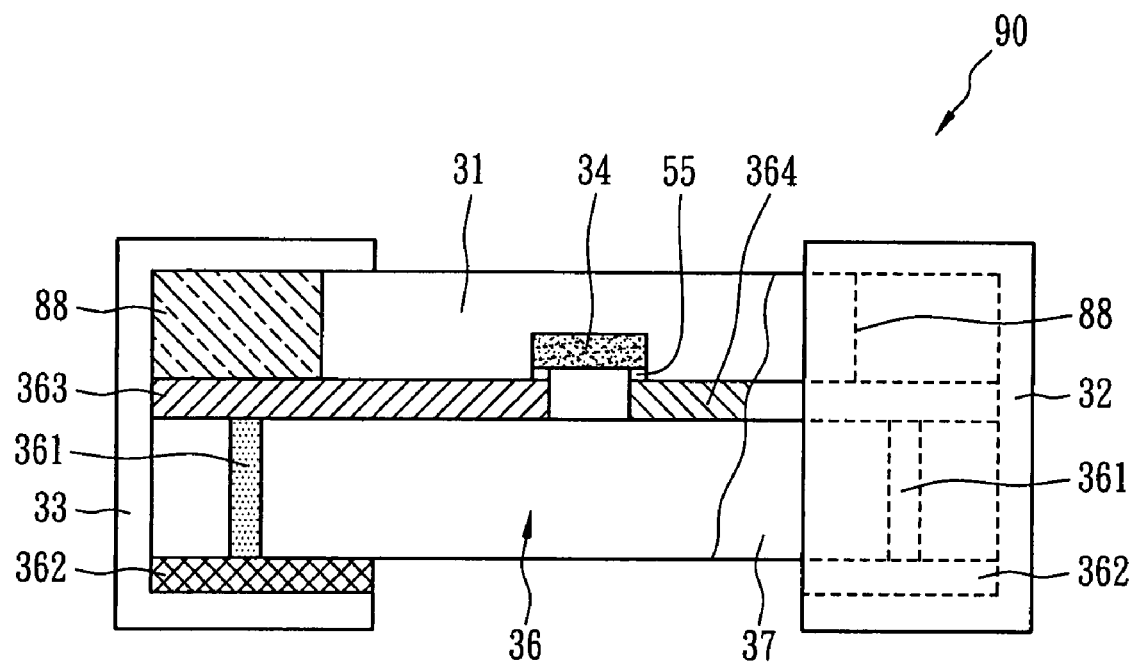
FIG. 9 is a cross-sectional side view of a package structure of an LED according to a fourth embodiment of the present invention.
Figure 10:
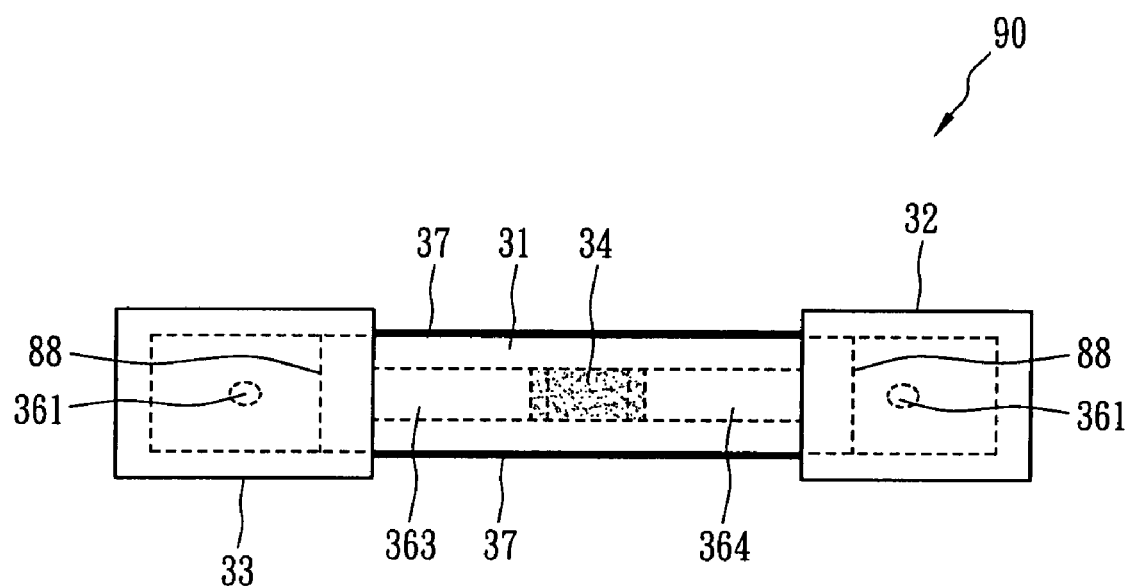
FIG. 10 is a top view of the LED in FIG. 9.

Compared with the LED 70 that is a wire-bonding package device, the LED 90 of FIG. 9 is a flip-chip package device. Similarly, the reflectors 88 are respectively disposed inside the first electrode 32 and the second electrode 33, so as to concentratedly direct the rays emitted towards the end portion to pass through the top surface. FIG. 10 is a top view of the LED of FIG. 9.

Figure 11:
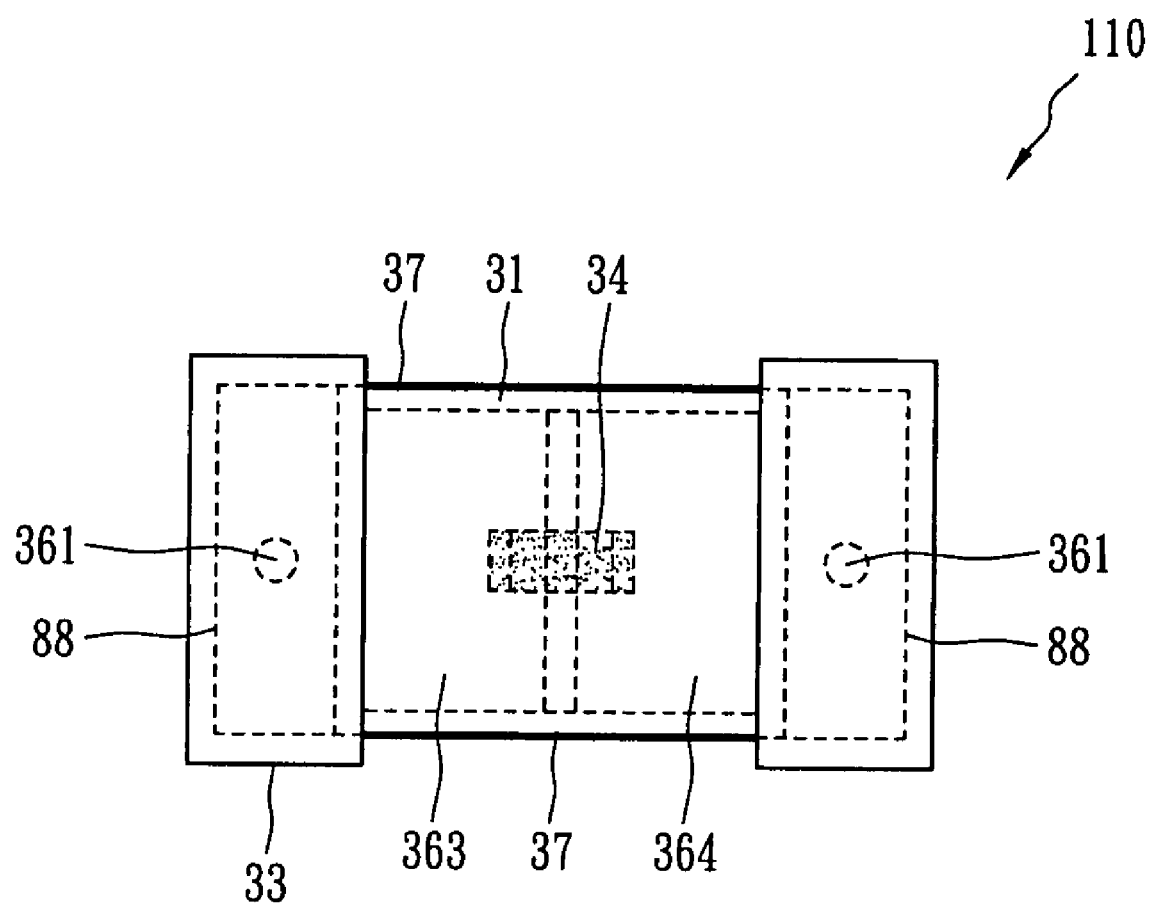
FIG. 11 is a top view of a package structure of an LED according to a fifth embodiment of the present invention.

FIG. 11 is a top view of a package structure of an LED according to a fifth embodiment of the present invention. Compared with the LED 90 in FIG. 10, the size of the LED 110 is different, but the elements and structure are the same.

The aforementioned descriptions of the present invention are intended to be illustrative only. Numerous alternative methods may be devised by persons skilled in the art without departing from the scope of the following claims.

What is claimed is:

1. A package structure of a light-emitting diode (LED), comprising:
    a package carrier;
    an LED die mounted on and electrically connected to the package carrier;
    a molding compound overlaying the package carrier and the LED die;
    two electrodes respectively disposed on two opposite end portions of the molding compound and respectively electrically connected to two terminals of the LED die; and
    two reflecting layers respectively disposed on two opposite sides of the molding compound and between the two electrodes.

2. The package structure of an LED of claim 1, wherein the reflecting layer overlays two side surfaces of the molding compound facing the LED die so that rays emitted by the LED die are directed upwards through a circuit surface of the LED die.

3. The package structure of an LED of claim 1, wherein the reflecting layer is a material with superior light reflectivity.

4. The package structure of an LED of claim 3, wherein the material with superior reflectivity is a white paint.

5. The package structure of an LED of claim 1, wherein each of the electrodes has at least two surfaces perpendicular to each other.

6. The package structure of an LED of claim 1, wherein the package carrier is a ceramic material substrate, a plastic substrate or a lead frame.

7. The package structure of an LED of claim 1, wherein the two electrodes are respectively electrically connected to a P-terminal and an N-terminal of the LED die via electrode leads on a surface of the package carrier and conductive columns inside the package carrier.

8. The package structure of an LED of claim 1, wherein the LED die is electrically connected to the package carrier by a plurality of metal wires or a plurality of bumps.

9. The package structure of an LED of claim 1, wherein the molding compound has a fluorescent powder of yttrium aluminum garnet (YAG) series or silicate series.

10. A package structure of a light-emitting diode (LED), comprising:

a package carrier;

an LED die mounted on and electrically connected to the package carrier;

a molding compound overlaying the package carrier and the LED die;

two electrodes respectively disposed on two opposite end portions of the molding compound and respectively electrically connected to two terminals of the LED die;

at least one reflector disposed between one of the electrodes and the molding compound; and at least one reflecting layer disposed on a surface of the molding compound and between the two electrodes.

11. A package structure of a light-emitting diode (LED), comprising:

a package carrier;

an LED die mounted on and electrically connected to the package carrier;

a molding compound overlaying the package carrier and the LED die;

two electrodes respectively disposed on two opposite end portions of the molding compound and respectively electrically connected to two terminals of the LED die, wherein each of the electrodes has two surfaces vertical to each other; and at least one reflecting layer disposed on a surface of the molding compound.

12. A package structure of a light-emitting diode (LED), comprising:

a package carrier;

an LED die mounted on and electrically connected to the package carrier;

a molding compound overlaying the package carrier and the LED die;

two electrodes respectively disposed on two opposite end portions of the molding compound and respectively electrically connected to two terminals of the LED die, wherein each of the electrodes has five surfaces vertical to one another; and at least one reflecting layer disposed on a surface of the molding compound.

* * * * *